United States Patent [19]

Maeder

[11] Patent Number: 5,245,341
[45] Date of Patent: Sep. 14, 1993

[54] VIDEO ANALOG-TO-DIGITAL CONVERTER

[75] Inventor: Heinz Maeder, Weinfelden, Switzerland

[73] Assignee: Motorola, Inc., Schaumburg, Ill.

[21] Appl. No.: 828,837

[22] Filed: Jan. 31, 1992

[30] Foreign Application Priority Data

Feb. 23, 1991 [GB] United Kingdom ............... 9103847

[51] Int. Cl.5 ............................................. H03M 1/20
[52] U.S. Cl. ................................... 341/131; 341/155
[58] Field of Search ................... 341/131, 155, 118; 358/12, 13

[56] References Cited

U.S. PATENT DOCUMENTS

| 4,647,968 | 3/1987 | Willis | 341/155 X |
| 4,812,846 | 3/1989 | Noro | 341/131 |
| 4,914,439 | 4/1990 | Nakahashi et al. | 341/131 |
| 4,937,576 | 6/1990 | Yoshio et al. | 341/131 |
| 5,073,778 | 12/1991 | Ueki et al. | 341/131 |

Primary Examiner—Sharon D. Logan
Attorney, Agent, or Firm—Michael D. Bingham

[57] ABSTRACT

This invention relates to a video analog-to-digital converter (ADC) and to a method of digitizing a video analog signal. The video ADC (2) comprises a clock for providing a clock signal (HZ) which clocks a horizontal line rate, dither generating means (10) for generating a dither pattern synchronized with the horizontal clock signal. A preferred dither pattern comprises a staircase sequence of voltage steps, the voltage level of each step being constant for at least one horizontal line. The video ADC further comprises combining means for combining the dither pattern with the analog video signal, digitizing means (4, 6) for converting the combined dither pattern and video signal to a sequence of digital values and correcting means (12) coupled to the digitizing means and the dither generating means for subtracting the dither pattern from the digitized sequence of values so as to generate a sequence of digital values which represent said analog video signal. By superimposing a dither pattern to the analog video signal at the horizontal line rate, the operating point of the ADC can be altered. As a result, step errors of the ADC do not occur at the same horizontal position on a line and are therefore less visible.

In a preferred arrangement, the dither pattern is superimposed on a plurality of reference voltage levels generated by bias means (8) and which are applied to the digitizing means so that the dither pattern and the analog video signal are combined in the digitizing means.

21 Claims, 6 Drawing Sheets

*FIG.3a*
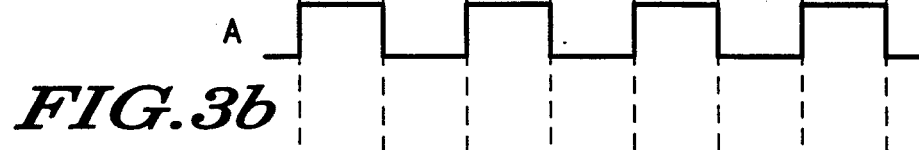
*FIG.3b*
*FIG.3c*
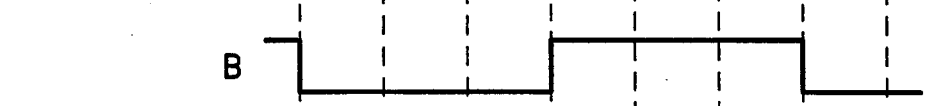
*FIG.3d*
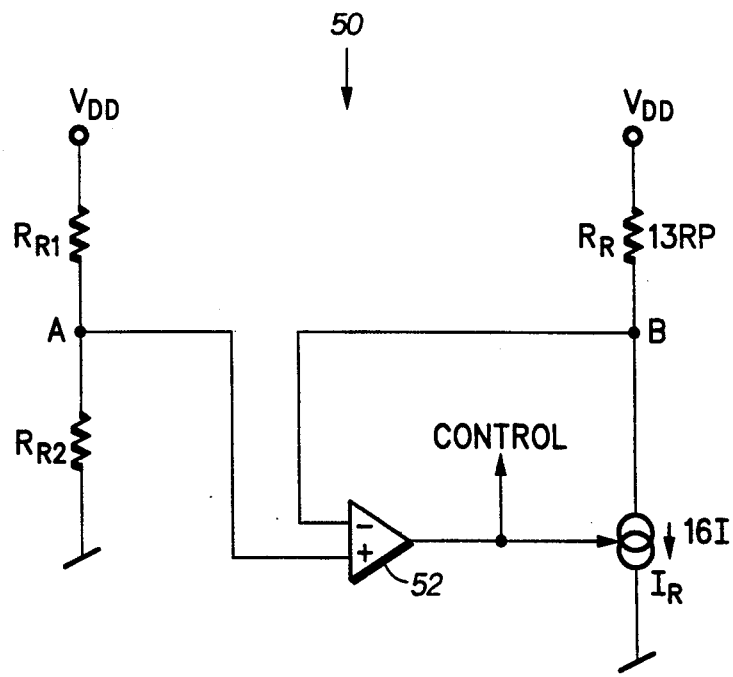
*FIG.5*

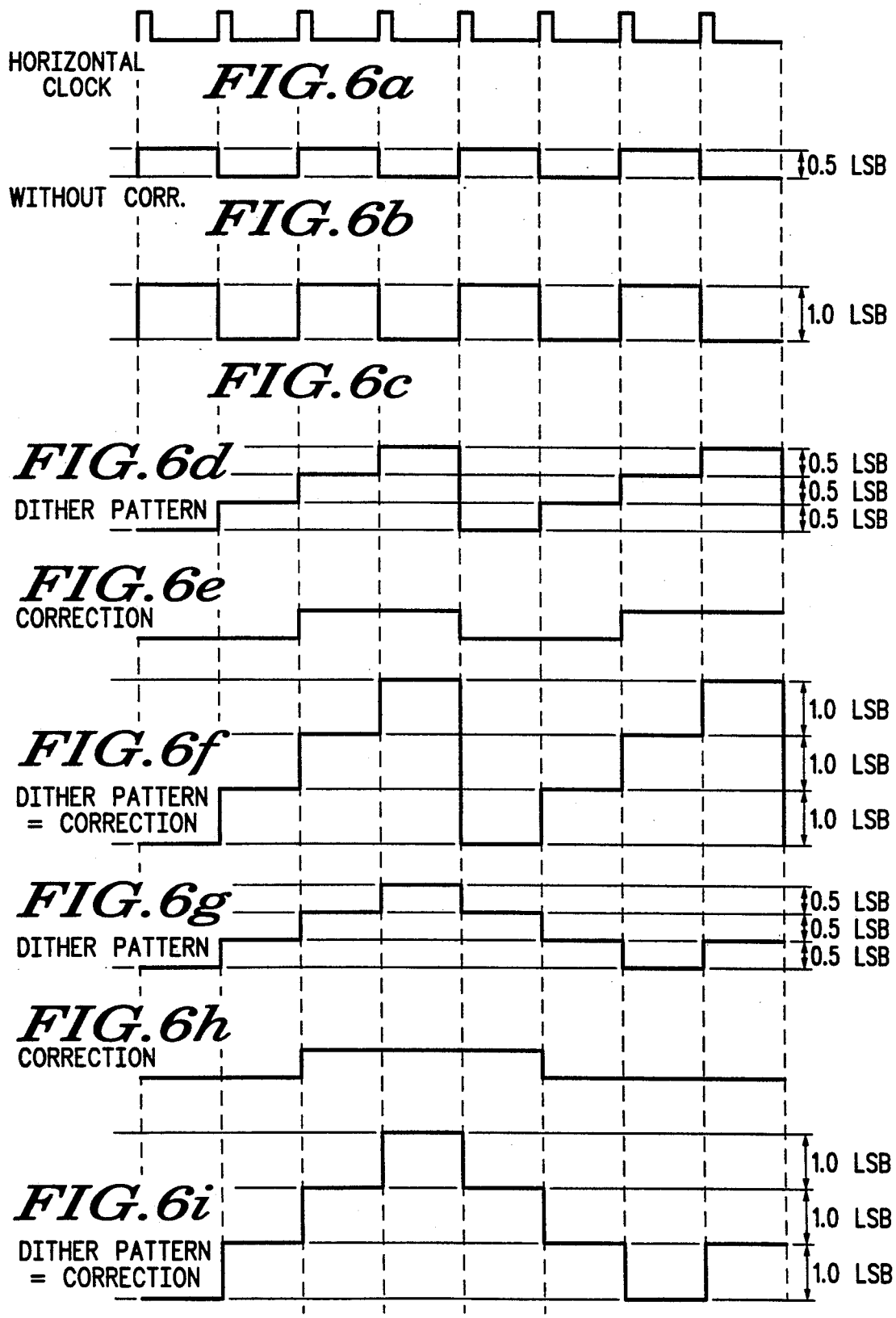

INPUT VIDEO RAMP
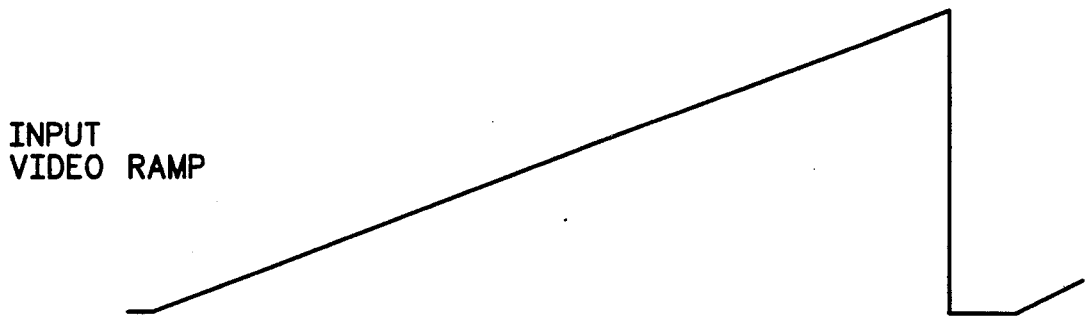
FIG. 7a
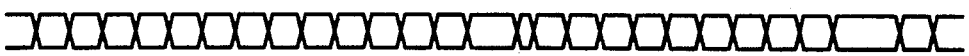 LINE n
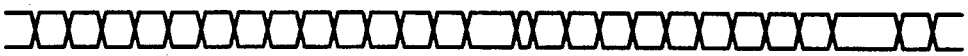 LINE n+1
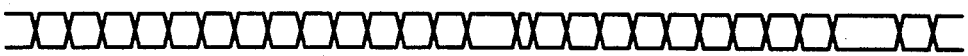 LINE n+2
 LINE n+3
 LINE n+4
FIG. 7b
—PRIOR ART—
↑
X
 LINE n
 LINE n+1
 LINE n+2
 LINE n+3
 LINE n+4
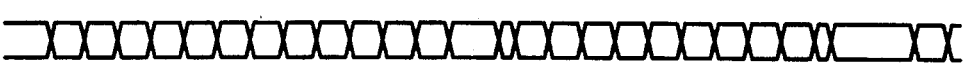 LINE n+5
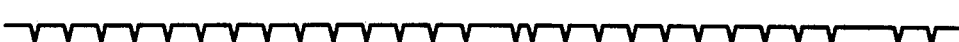 LINE n+6
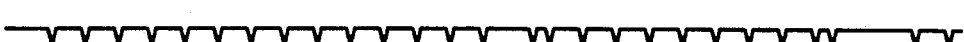 LINE n+7
FIG. 7c
↑
Y

VIDEO ANALOG-TO-DIGITAL CONVERTER

FIELD OF THE INVENTION

This invention relates to a video analog-to-digital converter (ADC) and to a method of digitizing a video analog signal.

BACKGROUND OF THE INVENTION

It is well known in the art that the accuracy of an ADC is ultimately limited by the fact that it cannot by itself respond to analog signals less than half a least significant bit (LSB) in amplitude and that its response thereafter is in a series of steps, each equal to one LSB.

A method of reducing the effect of these step errors on the accuracy of ADCs in a digital oscilloscope system using repetitive analog input signals is described in UK patent no. 2067373 which discloses means for combining a dither pattern generated by a dither generator with a repetitive analog input signal prior to digitizing the analog signal. The dither pattern comprises a sequence of voltage levels corresponding in magnitude to different multiples of the LSB produced by the ADC. Each voltage level of the sequence of voltage levels is generated sequentially, clocked in response to the repetition of the analog input signal, and then combined with different repetitions of the analog input signal.

ADCs are now being used in video systems for digital processing of the video signal. Video ADCs also suffer from problems due to the step errors, however, in video systems the effect of the step errors is more pronounced in that the step errors can be seen on the picture screen and so reduce the quality of the picture.

The existence of step errors of video ADCs can best be seen on a TV screen when carrying out a horizontal grey scale test for picture linearity. At each step error, the graduality of the grey value will be disturbed and since this error occurs for conventional ADCs at the same horizontal position on each scanning line of the picture, an observer will be able to identify vertical lines which are caused by the step error of the video ADC. The effect is further accentuated by the horizontal edge enhancement circuit of the video amplifier. The edge enhancement circuit increases the bandwidth so as to sharpen the transients at the edges of the picture: otherwise the sharp transients at the edge of the picture result in bandwidth loss and blurred edges. However, the edge enhancement circuit also amplifies the error of the ADC across the whole line.

The above referenced UK patent relates to the generation of a dither pattern in response to the repetition of an analog signal: a video signal is not a repetitive signal since each line of a picture is made up of different levels of black and white. This patent does not address nor provide a solution to the specific problems which arise when converting video analog signals to a sequence of digital values.

SUMMARY OF INVENTION

Thus, it is an object of the present invention to provide an improved video ADC system.

In accordance with the invention, there is provided a video analog-to-digital converter for converting an analog video signal to a sequence of digital values comprising:

a clock for providing a clock signal which clocks a horizontal line rate;

dither generating means for generating a dither pattern synchronised with the horizontal clock signal;

combining means for combining the dither pattern with the analog video signal;

digitizing means for converting the combined dither pattern and video signal to a sequence of digital values; and correcting means coupled to the digitizing means and the dither generating means for subtracting the dither pattern from the digitised sequence of values so as to generate a sequence of digital values which represent said analog video signal.

An advantage of the invention is that by superimposing a dither pattern to the analog video signal at the horizontal line rate, the operating point of the ADC can be altered and since the dither pattern is generated at the horizontal line rate, the generation of the dither pattern will always be synchronised to the line signal on the screen thereby ensuring that unwanted patterns do not destroy the video contents. As a result, the step errors do not occur at the same horizontal position on a line and are therefore less visible.

Preferably, the dither pattern comprises a voltage signal having a constant level for at least one horizontal line. The level of the voltage signal can be changed in step wise manner for each consecutive horizontal line, each of the levels being a fraction or a multiple of a digital bit generated by the digitizing means. Thus, the step error produced by the ADC is displaced for each consecutive line such that the step error is more randomly positioned on the screen and hence is less visible.

Preferably, the video analog-to-digital converter further comprising bias means for providing a plurality of reference voltage levels to the digitizing means, the dither generating means being coupled to the bias means such that each of the plurality of reference voltage levels is changed by an amount which is determined by the dither pattern whereby the dither pattern and the analog video signal are combined in the digitizing means. The advantage of this is that no extra circuitry need be incorporated for combining the dither pattern and the analog video signal.

In a preferred arrangement, the bias generator comprises at least one dither generating cell which in response to the dither pattern from the dither generating means adds a predetermined voltage level to each of the plurality of reference voltage levels. The plurality of reference voltage levels being generated by a ladder network of resistors which divide a supply voltage. A dither cell may comprise switching means coupled to a plurality of current sources and a resistance, and the dither pattern comprises control signals which are applied to the switching means for selectively applying currents from the plurality of current sources to the resistance so as to generate the predetermined voltage level.

Preferably, the correcting means comprises a binary adder for receiving the dither pattern from the dither generating means and for adding the inverse of the dither pattern to the digitised sequence of values so as to restore the original analog video signal in the digital representation of the analog video signal. For dither patterns comprising first and second control signals having voltage levels which are fractional multiples of a digital bit generated by the digitizing means, the binary adder adds the inverse of the first control signal to the digitised sequence of values so as to restore the original analog video signal in the digital representation of the analog video signal.

BRIEF DESCRIPTION OF THE DRAWINGS

An ADC system in accordance with the invention will now be described, by way of example only, with reference to the accompanying drawings in which:

FIG. 3a shows the horizontal clock signal;

FIG. 3b and FIG. 3c are diagrammatic representations of control signals for controlling dither generator cells of the bias generator of FIG. 2;

FIG. 3d is a diagrammatic representation of the output voltage of the dither generator cell in accordance with the present invention;

FIG. 5 is a schematic circuit diagram of a current bias circuit of the dither generator cell of FIG. 4;

FIG. 6a shows the horizontal clock signal as in FIG. 3a;

FIGS. 6b–6i are diagrammatic representations of different dither patterns generated in accordance with the present invention;

FIG. 7a is a diagrammatic representation of a video ramp signal;

FIG. 7b is a diagrammatic representation of a prior art video signal over five lines; and FIG. 7c is a diagrammatic representation of a video signal produced by the present invention over eight lines.

DETAILED DESCRIPTION OF THE INVENTION

Figure 1:
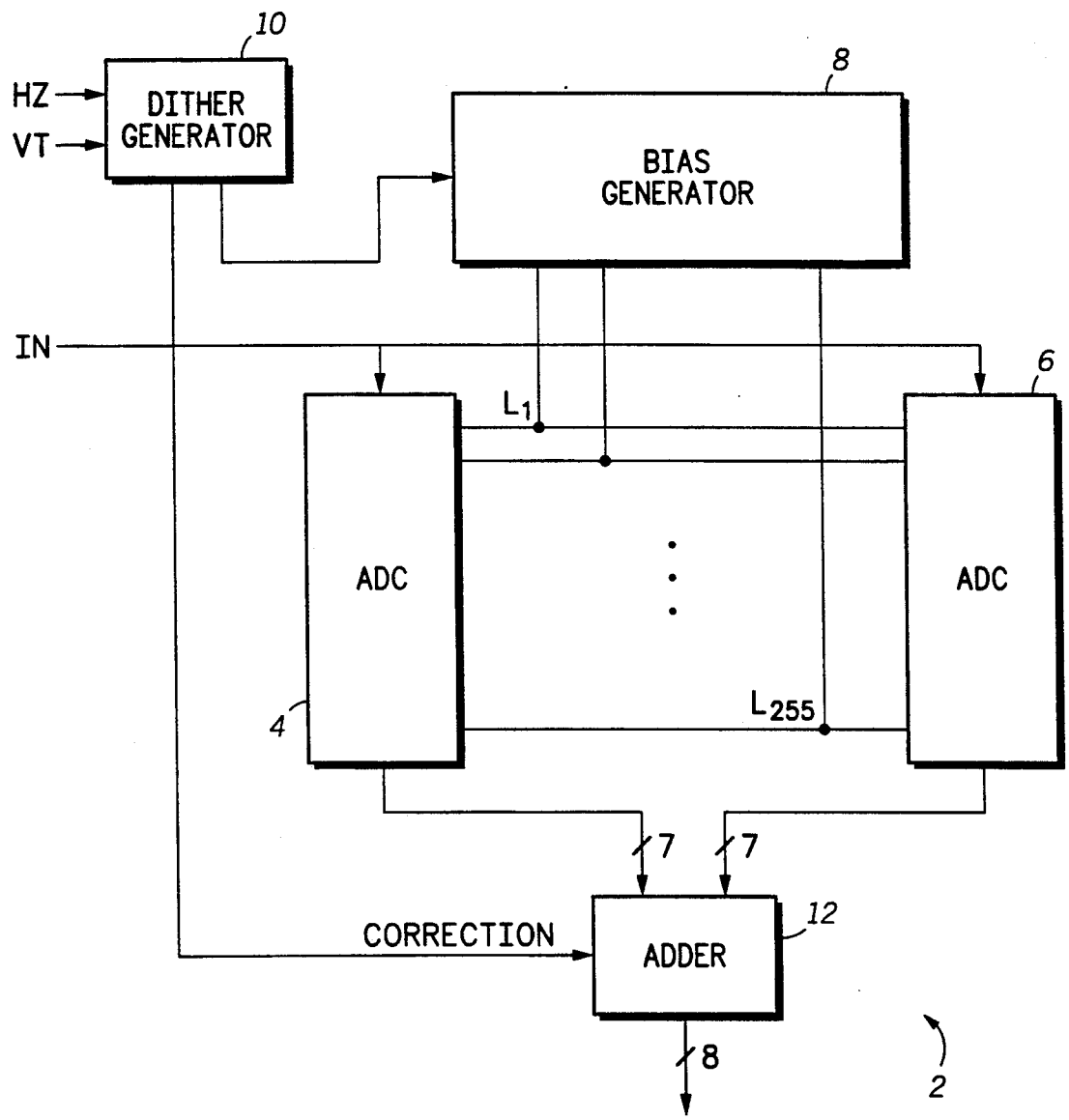
FIG. 1 is a block schematic diagram of an ADC system in accordance with the present invention.

Referring to FIG. 1, an analog-to-digital converter 2 in accordance with the invention comprises two 7-bit analog-to-digital converters 4 and 6 each having an input IN for receiving a video signal. A bias generator 8 provides a plurality of reference voltages on the lines L1-L255 to the reference inputs of both of the analog-to-digital converters 4, 6. Since 7-bit analog-to-digital converters are used, at least 255 different reference voltage levels are applied to the reference inputs of the analog-to-digital converters. An output from each one of the analog-to-digital converters 4 and 6 is coupled to a binary adder 12 having an output (OUTPUT) for coupling to other circuits in the video system (not shown).

A dither pattern generator 10 has a first input for receiving a horizontal clock signal which clocks the line rate i.e. the rate at which the spot traverses the picture screen (not shown), and a second input for receiving a vertical clock signal VT which resets the dither pattern generator 10 per picture frame. A first output of the dither pattern generator 10 is coupled to the bias generator 8 and a second output of the dither pattern generator 10 is coupled to the binary adder 12.

The dither pattern generator 10 provides a dither pattern to the bias generator 8 which is superimposed to the reference voltages provided by the bias generator 8 so that the outputs from the two analog-to-digital converters 4 and 6 each comprise the digitised video signal to which the dither pattern has been added. The outputs from the two ADCs are combined in the binary adder 12 together with a correction, provided from the dither pattern generator 10. A correction is added to the combined output so as to subtract the dither pattern from the output of the ADC so as to restore the video contents of the digitised signal. The correction may comprise, in some cases, the inverse of the dither pattern itself. The generation of the dither pattern will be described in more detail below.

Video applications typically require ADCs with 8 bit resolution. An 8 bit ADC can suffer from offset problems which restricts the resolution and so in the preferred embodiment two 7 bit ADCs are used and their outputs combined so as to provide an overall 8 bit resolution. The offset problems are reduced by having common reference voltages provided by the bias generator 8.

Figure 2:
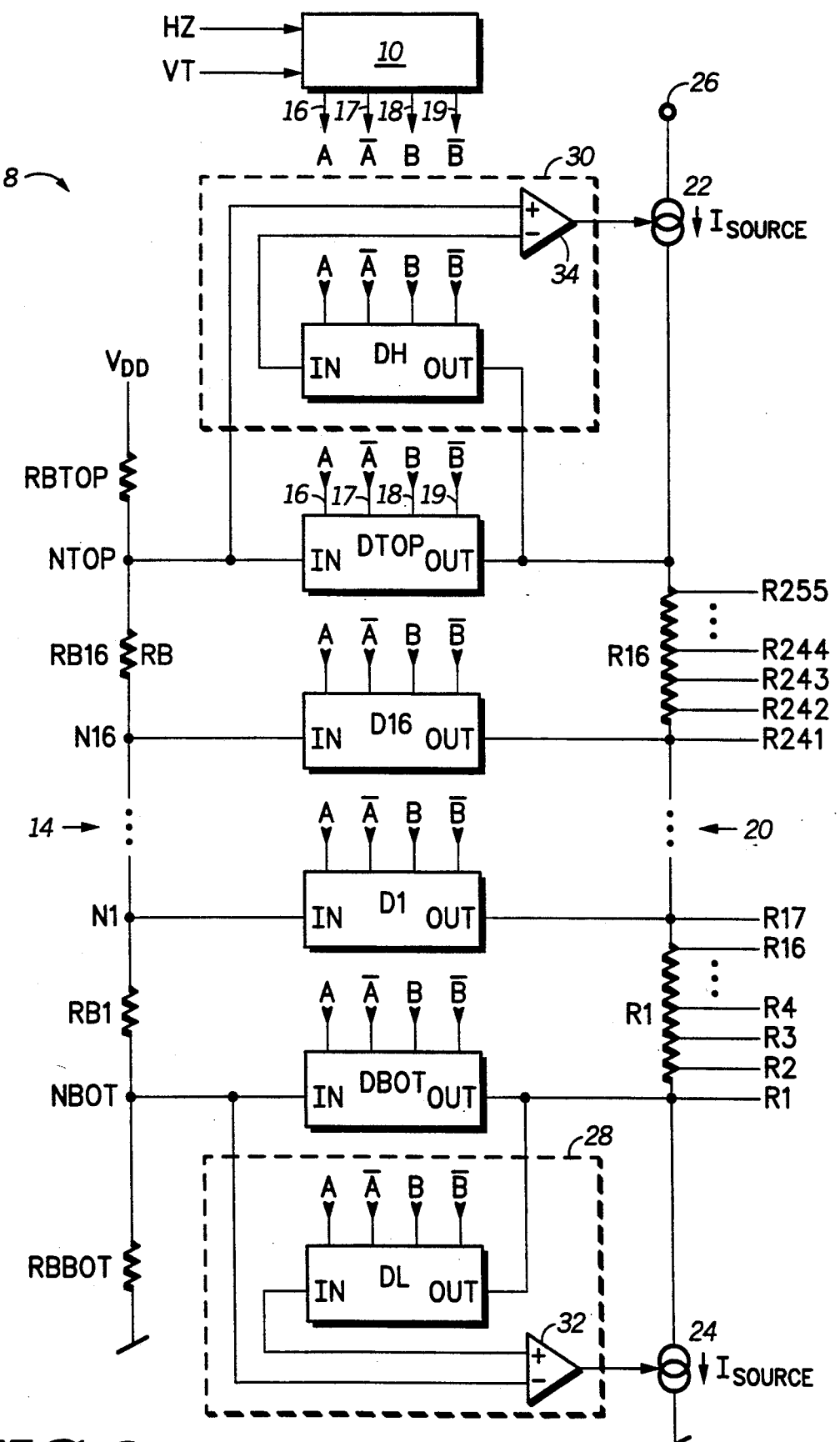
FIG. 2 is a block schematic diagram of a bias generator of the system of FIG. 1.

Referring now also to FIG. 2, the bias generator 8 comprises a first resistor network 14 coupled between a supply voltage VDD and ground. The first resistor network 14 comprises a plurality of resistors RB1-RB16, RBBOT and RBTOP coupled in series and which generate a primary set of reference voltages. The reference voltages are tapped at a plurality of nodes NBOT, N1-N16 and NTOP located between each pair of serially connected resistors. The ADC is intended to operate over the voltage range VTOP to VBOT. The resistors RB1-RB16 are of equal value, hence the tappings at the nodes NBOT, N1-N16, NTOP provide regularly spaced primary voltage references over the input voltage range of the ADC. For an 8 bit ADC, the primary reference voltage spacing is 16 LSBs.

The bias generator 8 further comprises a plurality of dither generator cells DBOT, D1-D16 and DTOP. Each of the dither generator cells DBOT, D1-D16 and DTOP has an input terminal IN and an output terminal OUT and receives digital control signals on four lines 16, 17, 18 and 19 from the dither pattern generator 10. Control line 16 receives a first control signal A, control line 17 receives the complement of the first control signal $\overline{A}$, control line 18 receives a second control signal B and control line 19 receives the complement of the second control signal $\overline{B}$. The control signals A and B can be in one of two states: high or low. FIGS. 3b and 3c show a diagrammatic representation of the signals A and B.

The control signals which represent the dither pattern are generated by the dither pattern generator 10 which in effect acts as a frequency divider to generate binary control signals which are a sub-multiple frequency of the horizontal clock rate: the horizontal clock signal is shown in FIG. 3a. The dither pattern will therefore always be synchronised to the horizontal clock rate. This is important for video systems since if the dither pattern is not synchronised, an undesired pattern will be superimposed on the video signal disturbing the picture. The control signals are also fed to the binary adder 12 as the corrections to be added (in the digital domain) to the combined outputs of the two ADCs 4 and 6.

The nodes NBOT, N1-N16 and NTOP are each coupled to the input terminal IN of a respective one of the dither generator cells DBOT, D1-D16 and DTOP. The dither generator cells DBOT, D1-D16 and DTOP translate the digital dither pattern generated by the dither pattern generator 10 to an analog signal which is then superimposed onto the primary reference voltages tapped at nodes NBOT, N1-N16 and NTOP. The output voltage (Vout) of the dither generator cells is a floating voltage and is the voltage difference between the voltage at the output terminal OUT and the voltage at the input terminal IN. Assuming that the dither generator cells DBOT, D1–D16 and DTOP are ideal controlled voltage sources, the output voltage of each dither generator cell Vout as a function of the control signals A and B is given below in Table 1.

| A | B | $V_{out}$ |
|---|---|---|
| L | L | −0.75 LSB |
| H | L | −0.25 LSB |
| L | H | +0.25 LSB |
| H | H | +0.75 LSB | where
L is low
H is high.

FIG. 3d shows a diagrammatic representation of the output voltage Vout from each dither generator cell according to the sequence of A and B control signals shown in Table 1.

A second resistor network 20 is coupled in parallel to the first resistor network 14 by means of the dither generator cells DBOT, D1–D16 and DTOP. The second resistor network comprises a plurality of resistors R1–R16 coupled in series. Each of the resistors R1–R16 is coupled between the outputs of two neighbouring dither generator cells. Despite the considerably low impedance of the first resistor network 14, it is preferred that the first resistor network 14 is not loaded by the second resistor network 20, since this would cause an integral nonlinearity error in the ADC. For this reason, the second resistor network 20 is dc-biased by a current source 22 and a current sink 24. The current source 22 is coupled between a terminal 26 which receives a supply voltage VDD and a first terminal of the resistor R16.

The current sink 24 is controlled by an amplifier 32 in a negative feedback loop. Amplifier 32 has a first input terminal connected to node NBOT and a second input terminal coupled to the output terminal of DBOT via similar dither generator cell DL. Dither generator cell DL has its input terminal connected to the input of amplifier 32 and its output terminal connected to the output of dither generator cell DBOT. In consequence, the dither voltages generated in the path from NBOT to the second input terminal of 32 cancel and the amplifier receives a differential input voltage equal only to any error voltage developed across DBOT. The negative feedback will ensure that the sink current I is adjusted to minimize this error voltage. The voltage at the output of DBOT will therefore be maintained substantially equal to that at the node NBOT, plus the dither voltage, independently of any DC loading.

The current source generator 22 is controlled by amplifier 34 in a negative feedback arrangement which is similar to the above described arrangement.

The serially connected resistors R1–R16 of the second resistor network 20 are tapped at regularly intervals to provide the correct secondary reference voltages $V_{R1}$–$V_{R255}$ for the ADC on the lines L1–L255. In the preferred embodiment, two 7 bit ADCs are implemented which together provide 8 bit resolution and therefore, 255 voltage levels are required. As discussed above, the dither generator cells DBOT, D1–D16 and DBOT each superimpose an analog dither pattern determined by the control signals A, $\overline{A}$, B and $\overline{B}$ onto the primary reference voltages so that the secondary reference voltages at R1–R255 include the dither pattern.

From the above, it will be appreciated that the bias generator 8 of FIG. 2 can provide the correct reference voltages $V_{R1}$–$V_{R255}$ over the ADC range in the absence of the dither generator cells D1–D16. The dither generator cells D1–D16 are merely provided to lower the impedance of the resistors in the second resistor network 20 to satisfy dynamic requirements of the ADC. In the absence of the dither generator cells D1 to D16, the dither voltage is superimposed on all reference voltages (R1 to R255) by means of the dither voltage generators DBOT and DTOP. The dither generator cells D1 to D16 are also superimposing dither signals on the secondary reference voltage network, however, this contribution with respect to the reference voltages R1 to R255 is negligible. The relevant contribution of the dither generator cells D1 to D16 is to lower the effective impedance of the second reference network. It will be appreciated that one dither generator cell would be sufficient to generate the dither voltage to be superimposed on the secondary reference voltages.

It will be appreciated that as indicated by the dotted lines in FIG. 2 not all of the resistors of the first and second resistor networks and the dither generator cells are shown. However, the resistors RB2–RB14 (not shown) of the first resistor network are coupled in parallel to resistors R2–R15 (not shown) of the second resistor network via dither generator cells in an identical manner as that shown, for example, by RB1, R1 and D1 and DBOT.

Figure 4:
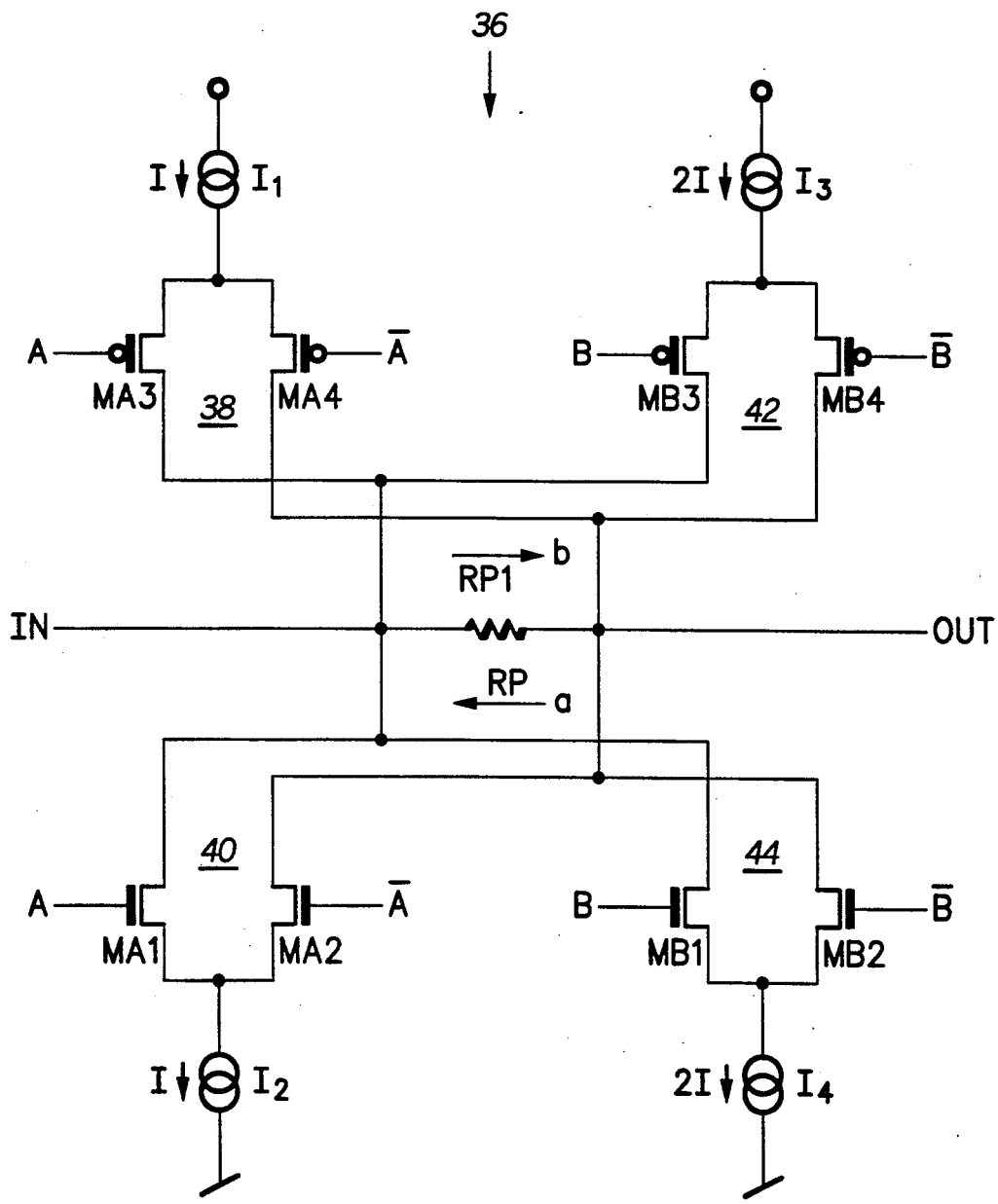
FIG. 4 is a simplified circuit diagram of a dither generator cell in accordance with the present invention.

FIG. 4 shows a simplified circuit diagram of a dither generator cell in accordance with a preferred embodiment of the present invention. The dither generator cell comprises an input terminal IN coupled to an output terminal OUT via a resistor RP1 of value RP and current source and sink pairs $I_1$ and $I_2$ of value I, and $I_3$ and $I_4$ of value 2I respectively. First 38, second 40, third 42 and fourth 44 differential amplifiers are coupled across first and second terminals of the resistor RP1 so as to control the direction and magnitude of the flow of current through the resistor RP1 in response to control signals A, $\overline{A}$, B and $\overline{B}$. Control signals A and B are shown in FIGS. 3b and 3c respectively and each signal can be in one of two states: high or low.

The first differential amplifier 38 comprises a first p-channel MOSFET transistor MA3 and a second p-channel MOSFET transistor MA4. The source electrodes of the first and second MOSFETs MA3 and MA4 are coupled together to a current source $I_1$ which provides a current I thereto. The gate electrode of the first MOSFET MA3 is coupled to the control line 16 to receive the control signal A and the gate electrode of the second MOSFET MA4 is coupled to the control line 17 to receive the control signal $\overline{A}$. The drain electrode of the first MOSFET MA3 is coupled to the first terminal of the resistor RP1 and the drain electrode of the second MOSFET MA4 is coupled to the second terminal of the resistor RP1.

The second differential amplifier 40 comprises a first n-channel MOSFET transistor MA1 and a second n-channel MOSFET transistor MA2. The source electrodes of the first and second MOSFETS MA1 and MA2 are coupled together to a current sink $I_2$ which sinks a current I. The gate electrode of the first MOSFET MA1 is coupled to the control line 16 to receive the control signal A and the gate electrode of the second MOSFET MA2 is coupled to the control line 17 to receive the control signal $\overline{A}$. The drain electrode of the first MOSFET MA1 is coupled to the first terminal of the resistor RP1 and the drain electrode of the second MOSFET MA2 is coupled to the second terminal of the resistor RP1.

The third differential amplifier 42 is similar to the first differential amplifier 38 in that it comprises first MB3 and second MB4 p-channel MOSFET transistors coupled to a current source $I_3$, which provides a current 2I to the source electrodes of the first MB3 and second MB4 MOSFETs, and coupled to the first and second terminals of the resistor RP1: the drain electrode of the first MOSFET MB3 being coupled to the first terminal and the drain electrode of the second MOSFET MB4 being coupled to the second terminal. The gate electrode of the first MOSFET MB3 is coupled to the control line 18 to receive the control signal B and the gate electrode of the second MOSFET MB4 is coupled to the control line 19 to receive the control signal $\overline{B}$.

The fourth differential amplifier 44 is similar to the second differential amplifier 40 in that it comprises first MB1 and second MB2 n-channel MOSFET transistors coupled to a current sink $I_4$, which sinks a current 2I from the source electrodes of the first MB1 and second MB2 MOSFETs, and coupled to the first and second terminals of the resistor RP1: the drain electrode of the first MOSFET MB1 being coupled to the first terminal and the drain electrode of the second MOSFET MB2 being coupled to the second terminal. The gate electrode of the first MOSFET MB1 is coupled to the control line 18 to receive the control signal B and the gate electrode of the second MOSFET MB2 is coupled to the control line 19 to receive the control signal $\overline{B}$.

The manner in which the dither generator cell 36 operates will now be described.

With the control signal A in the high state (H) and its complement $\overline{A}$ in the low state (L), the MOSFET transistors MA1 and MA4 are 'on', and the MOSFET transistors MA2 and MA3 are 'off'. This causes the current I to flow through the current source $I_1$, through MOSFET transistor MA4, resistor RP1, MOSFET transistor MA1 and the current sink $I_2$: that is the current flows through the resistor RP1 in the direction a.

With the control signal A in the low state (L) and its complement $\overline{A}$ in the high state (H), the MOSFET transistors MA2 and MA3 are 'on' and the MOSFET transistors MA1 and MA4 are 'off'. In this case the current I flows through MOSFET transistor MA3, resistor RP1, MOSFET transistor MA2 and the current sink $I_2$ so that the current flow in RP1 is reversed: that is the current flows through the resistor RP1 in the direction b.

The operation of the differential amplifiers 42 and 44 is identical except that the current flow through the resistor is 2I since the current source and sink provide a current of 2I. The current of the sources $I_1$ and $I_3$ and the sinks $I_2$ and $I_4$ are controlled by a bias circuit (which is shown in FIG. 5) so that a voltage drop across the resistor RP1 is generated according to Table 2 given below. The current I and the resistor RP1 are arranged so that the voltage drop IR across the resistor is ±0.25 LSB.

| A | B | I RP1 | $V_{out}$ |
|---|---|---|---|
| L | L | −3I | −0.75 LSB |
| H | L | −I | −0.25 LSB |
| L | H | +I | +0.25 LSB |

-continued

| A | B | I RP1 | $V_{out}$ |
|---|---|---|---|
| H | H | +3I | +0.75 LSB | where
L is low
H is high.

FIG. 3d shows the dither pattern which is generated at the output of the dither generator cell 36 according to the sequence of A and B control signals shown in Table 2. The dither pattern is generated with steps of 0.5 LSB.

Referring now to FIG. 5, the current sources $I_1$ and $I_3$ and sinks $I_2$ and $I_4$ of the dither generator cell 36 are controlled from a common bias circuit 50. The bias circuit 50 comprises first and second resistors $R_{R1}$ and $R_{R2}$ coupled in series between the voltage supply line at $V_{DD}$ and ground, an operational amplifier 52 and a reference current sink $I_R$ coupled in series with a third resistor $R_R$ between ground and the voltage supply line at $V_{DD}$. The ratio of the values of the first $R_{R1}$ and second $R_{R2}$ resistors is 1:7. The value of the third resistor $R_R$ is 13 RP (where RP is the value of the resistor RP1 of the dither generator cell).

The operational amplifier 52 is coupled in a feedback arrangement to control the reference current sink $I_R$. In the preferred embodiment the current sink sinks a current equal to 16I, the value of which is chosen to match the ADC requirement of 1LSB is equal to 12.0 mV at nominal. The non-inverting input of the operational amplifier 52 is coupled to a node A between the first and second resistors, and the inverting input of the operational amplifier 52 is coupled to a node B between the third resistor $R_R$ and the reference current sink $I_R$. The output of the operational amplifier 52 is fed to the reference current sink $I_R$. The negative feedback arrangement ensures that the voltage drop across the resistor $R_R$ becomes substantially equal to the voltage drop across the resistor $R_{R1}$ (an ideal operational amplifier has been assumed).

The reference current sink $I_R$ of the bias circuit 50 and the current sinks $I_2$ and $I_4$ of the dither generator cells are arranged so that they all comprise identical NMOS transistors (or multiples thereof). Therefore, the current sinks of the dither generator cells sink the same current or a predetermined proportion thereof as that sunk by the reference current sink $I_R$ of the bias circuit 50. The output voltage ($V_{OUT}$) of the dither generator cells therefore becomes entirely controlled by device and resistor ratios and the power supply voltage $V_{DD}$. Thus, a good match between the output voltages of the dither generator cells and the reference voltages is obtained since the reference voltages also depend entirely on the ratios of the matched resistors and the power supply voltage $V_{DD}$.

It will now be apparent that the binary control signals A and B, which are generated by the dither pattern generator 10 as sub-multiple frequencies of the horizontal line rate, are translated to analog signals and superimposed on the reference voltages generated at R1-R16 of the second network so that the complement of the dither pattern comprising a sequence of steps is superimposed on the reference voltages. FIG. 3d shows an example of a dither pattern which is generated for a particular sequence of the binary signals A and B: the 'four-step' sequence is shown in Table 2.

FIG. 6 shows a number of suitable dither patterns which can be generated by the dither generator cells and superimposed as an analog signal on the secondary reference voltages according to the control signals A and B. The 1LSB step dither patterns are generated by doubling the currents sourced and sunk by the current sources and sinks $I_1$, $I_3$ and $I_2$, $I_4$ respectively, of FIG. 4.

FIG. 6a shows the horizontal clock fed to the dither pattern generator 10. For the dither patterns having 1LSB steps, (FIGS. 6c, 6f, and 6i) the inverse of the dither pattern itself (i.e. inverse of signals A and B) is fed as a correction pattern to the binary adder 12. The inverse of the dither pattern is added to the combined output of the two ADCs 4 and 6 so as to cancel the dither pattern superimposed on the video signal and to thereby restore the video contents of the input signal IN. For the dither patterns having 0.5 LSB steps, (FIGS. 6d and 6g) the correction pattern (FIGS. 6e and 6h respectively) is formed by the dither pattern generator 10 by rounding the dither pattern to 1 LSB resolution: that is the inverse of the control signal B is fed to the binary adder for 1 bit correction.

The preferred dither pattern has been found by experiment to be the staircase dither pattern with 0.5LSB steps as shown in FIGS. 3d and 6g. The correction signal fed to the binary adder is the control signal B of FIGS. 3c and 6h.

A video picture is composed of two fields of lines (each field forming half a picture) which are interlaced and so can be thought of to comprise alternate even and odd lines. The dither voltage is incremented and decremented in steps for a predetermined number of lines and then repeated. Once the 'even' field is completed, the dither pattern repeats for a predetermined number of 'odd' lines. In the preferred embodiment in which the triangular dither pattern is used with 0.5 LSB steps, the dither voltage is incremented in 0.5 LSB steps for the first three consecutive even lines and then decremented in 0.5 LSB steps for the next three even consecutive lines and is then repeated. The overall effect is that the dither voltage changes line by line for twelve lines and is then repeated.

An advantage of the invention is that each step of the dither pattern is determined by the control signals A and B and thus, since A and B are sub-multiples of the horizontal clock signal, each step of the dither pattern will be synchronised to the horizontal clock. This ensures that the dither voltage changes during the invisible trace-back period and hence no visible disturbance is caused by the dithering.

At the beginning of the trace-back period of typically 5 to 10 ms, the dither voltage is incremented or decremented by means of the control signals A and B. The relatively long trace-back period of 5 to 10 ms ensures that there is ample time for the bias generator to settle to the beginning of the next line.

FIG. 7a shows a video ramp signal which is applied to a video system incorporating an ADC so as to visualize and compare the mode of operation of a prior art ADC and the ADC in accordance with the invention. This video ramp signal controls the brightness of the scanning spot across the screen.

FIG. 7b shows the zones of equal brightness caused by the quantisation of the digitised video signal. Since this pattern is painted line by line, vertical stripes of equal brightness appear on the screen. In the absence of step errors, all the vertical stripes are of equal width and the picture appears as a smooth gray scale. The step errors of the ADC, however, produce vertical stripes whose widths are no longer of equal length. These discontinuities appear to the observer as vertical lines: as seen at X on FIG. 7b.

FIG. 7c shows the zones of equal brightness caused by the quantisation of the digitised video signal in accordance with the invention. Due to the superimposition of a dither pattern, the step error is shifted for each consecutive line such that the step error (at Y) is more randomly distributed and hence is less visible.

It will be appreciated that instead of superimposing a dither pattern to the reference voltages which are supplied to the reference inputs of the analog-to-digital converters as described above, the dither pattern could be added to the video input signal before inputting to the analog-to-digital converters.

I claim:

1. A video analog-to-digital converter for converting an analog video signal to a sequence of digital values comprising:

a clock for providing a horizontal clock signal which clocks a horizontal line rate;

dither generating means for generating a dither pattern synchronized with the horizontal clock signal and having a frequency dependent on the frequency of the horizontal clock signal such that the dither pattern has a substantially constant value for at least one horizontal line;

combining means for combining the dither pattern with the analog video signal;

digitizing means for converting the combined dither pattern and video signal to a sequence of digital values; and correcting means coupled to the digitizing means and the dither generating means for subtracting for each horizontal line the dither pattern from the digitized sequence of values so as to generate a sequence of digital values which represent said analog video signal.

2. A video analog-to-digital converter according to claim 1 wherein the dither pattern comprises a voltage signal having a constant level for at least one horizontal line and wherein the level of the voltage signal changes in a step wise manner for each consecutive horizontal line.

3. A video analog-to-digital converter according to claim 2 wherein the step changes in the level of the voltage signal forms a staircase.

4. A video analog-to-digital converter according to claim 2 wherein the level of the voltage signal is a fraction or a multiple of a digital bit generated by the digitising means.

5. A video analog-to-digital converter according to claim 3 wherein the dither pattern comprises at least a three step voltage signal.

6. A video analog-to-digital converter according to claim 1 further comprising bias means for providing a plurality of reference voltage levels to the digitising means, the dither generating means being coupled to the bias means such that each of the plurality of reference voltage levels is changed by an amount which is determined by the dither pattern whereby the dither pattern and the analog video signal are combined in the digitising means.

7. A video analog-to-digital converter according to claim 6 wherein the bias means comprises a ladder network of resistors for dividing a supply voltage so as to produce the plurality of reference voltage levels at a plurality of output nodes, and at least one dither generator cell which in response to the dither pattern from the dither generating means adds a predetermined voltage level to each of the plurality of reference voltage levels at the plurality of output nodes.

8. A video analog-to-digital converter according to claim 7 wherein a dither generator cell comprises switching means coupled to a plurality of current sources and a resistance, and the dither pattern comprises control signals which are applied to the switching means for selectively applying currents from the plurality of current sources to the resistance so as to generate the predetermined voltage level.

9. A video analog-to-digital converter according to claim 8 wherein the control signals are sub-multiples of the horizontal clock signal.

10. A video analog-to-digital converter according to claim 7 wherein the ladder network of resistors comprises a first network of resistors coupled in series between the supply voltage and ground and a second network of resistors coupled in series between a controlled current source and current sink, the resistors of the first network being coupled in parallel to the resistors of the second network, and the at least one dither generator cell being coupled between the first and second resistor networks.

11. A video analog-to-digital converter according to claim 10 wherein the bias means comprises a plurality of the dither generator cells coupled between the first and second resistor networks.

12. A video analog-to-digital converter according to claim 1 wherein the correcting means comprises a binary adder for receiving the dither pattern from the dither generating means and for adding the inverse of the dither pattern to the digitised sequence of values so as to restore the original analog video signal in the digital representation of the analog video signal.

13. A video analog-to-digital converter according to claim 12 wherein the dither pattern comprises first and second control signals having voltage levels which are fractional multiples of a digital bit generated by the digitising means, the binary adder adding the inverse of the first control signal to the digitised sequence of values so as to restore the original analog video signal in the digital representation of the analog video signal.

14. A method of converting an analog video signal to a sequence of digital values comprising the steps of:
providing a horizontal clock signal which clocks a horizontal line rate;
generating a dither pattern synchronized with the horizontal clock signal and having a frequency dependent on the frequency of the horizontal clock signal such that the dither pattern has a substantially constant value for at least one horizontal line;
combining the dither pattern with the analog video signal;
converting the combined dither pattern and analog video signal to a sequence of digital values;
subtracting for each horizontal line the dither pattern from the sequence of digital values so as to generate a sequence of digital values which represent said analog video signal.

15. A method according to claim 14 wherein the level of the voltage signal changes in a step wise manner for each consecutive horizontal line in response to the horizontal clock signal.

16. A method according to claim 15 wherein the dither pattern comprises at least a three step voltage signal.

17. A video analog-to-digital converter for converting an analog video signal to a sequence of digital values comprising:
a clock for providing a horizontal clock signal which clocks a horizontal line rate;
dither generating means for generating a dither pattern synchronized with the horizontal clock signal;
combining means for combining the dither pattern with the analog video signal;
digitizing means for converting the combined dither pattern and video signal to a sequence of digital values;
bias means for providing a plurality of reference voltage levels to the digitizing means, the dither generating means being coupled to the bias means such that each of the plurality of reference voltage levels is changed by an amount which is determined by the dither pattern whereby the dither pattern and the analog video signal are combined in the digitizing means; and
correcting means coupled to the digitizing means and the dither generating means for subtracting the dither pattern from the digitized sequence of values so as to generate a sequence of digital values which represent said analog video signal.

18. A video analog-to-digital converter according to claim 17 wherein the bias means comprises a ladder network of resistors for dividing a supply voltage so as to produce the plurality of reference voltage levels at a plurality of output nodes, and at least one dither generator cell which in response to the dither pattern from the dither generating means adds a predetermined voltage level to each of the plurality of reference voltage levels at the plurality of output nodes.

19. A video analog-to-digital converter according to claim 18 wherein a dither generator cell comprises switching means coupled to a plurality of current sources and a resistance, and the dither pattern comprises control signals which are applied to the switching means for selectively applying currents from the plurality of current sources to the resistance so as to generate the predetermined voltage level.

20. A video analog-to-digital converter for converting an analog video signal to a sequence of digital values comprising:
a clock for providing a horizontal clock signal which clocks a horizontal line rate;
dither generating means for generating a dither pattern synchronized with the horizontal clock signal;
combining means for combining the dither pattern with the analog video signal;
digitizing means for converting the combined dither pattern and video signal to a sequence of digital values; and
correcting means coupled to the digitizing means and the dither generating means for subtracting the dither pattern from the digitized sequence of values so as to generate a sequence of digital values which represent said analog video signal, the correcting means comprising a binary adder for receiving the dither pattern from the dither generating means and for adding the inverse of the dither pattern to the digitized sequence of values so as to restore the original analog video signal in the digital representation of the analog video signal.

21. A video analog-to-digital converter according to claim 20 wherein the dither pattern comprises first and second control signals having voltage levels which are fractional multiples of a digital bit generated by the digitizing means, the binary adder adding the inverse of the first control signal to the digitized sequence of values so as to restore the original analog video signal in the digital representation of the analog video signal.

* * * * *